United States Patent
Shigematsu

(10) Patent No.: US 10,297,243 B2
(45) Date of Patent: May 21, 2019

(54) BUZZER UNIT AND SIGNAL INDICATOR LIGHT

(71) Applicant: PATLITE CORPORATION, Osaka (JP)

(72) Inventor: Daisuke Shigematsu, Osaka (JP)

(73) Assignee: PATLITE CORPORATION, Osaka (JP)

( * ) Notice: Subject to any disclaimer, the term of this patent is extended or adjusted under 35 U.S.C. 154(b) by 0 days.

(21) Appl. No.: 15/740,642

(22) PCT Filed: Jan. 22, 2016

(86) PCT No.: PCT/JP2016/051893
§ 371 (c)(1),
(2) Date: Dec. 28, 2017

(87) PCT Pub. No.: WO2017/126114
PCT Pub. Date: Jul. 27, 2017

(65) Prior Publication Data
US 2018/0197521 A1    Jul. 12, 2018

(51) Int. Cl.
| | |
|---|---|
| *G10K 9/122* | (2006.01) |
| *G08B 7/06* | (2006.01) |
| *G10K 9/22* | (2006.01) |
| *G08B 3/10* | (2006.01) |
| *H02N 2/00* | (2006.01) |
| *B06B 1/06* | (2006.01) |

(52) U.S. Cl.
CPC ............ *G10K 9/122* (2013.01); *B06B 1/0651* (2013.01); *G08B 3/10* (2013.01); *G08B 7/06* (2013.01); *G10K 9/22* (2013.01); *H02N 2/001* (2013.01); *H02N 2/0055* (2013.01)

(58) Field of Classification Search
None
See application file for complete search history.

(56) References Cited

U.S. PATENT DOCUMENTS

| | | | |
|---|---|---|---|
| 4,278,851 A * | 7/1981 | Takaya | G10K 9/122 310/322 |
| 4,641,054 A | 2/1987 | Takahata et al. | |
| 4,810,997 A * | 3/1989 | Kudo | G08B 3/10 340/384.6 |

(Continued)

FOREIGN PATENT DOCUMENTS

| | | |
|---|---|---|
| JP | S55-105498 U | 7/1980 |
| JP | S57-065092 A | 4/1982 |

(Continued)

*Primary Examiner* — John F Mortell
(74) *Attorney, Agent, or Firm* — Rabin & Berdo, P.C.

(57) ABSTRACT

A buzzer unit 4 includes a case 10, a vibrating element 11, and a pressing member 14. The case 10 includes a vibrating plate 28 in which no through-holes are formed. The case 10 includes a storage space 22 formed therein on the lower side X2 of the vibrating plate 28. The vibrating element 11 faces the vibrating plate 28 in the vertical direction X inside the storage space 22, produces vibration as a result of voltage being applied thereto, and as a result, causes the vibrating plate 28 to vibrate. The pressing member 14 is stored in the storage space 22, and presses the vibrating element 11 against the vibrating plate 28.

8 Claims, 5 Drawing Sheets

(56) References Cited

U.S. PATENT DOCUMENTS

| | | | | | |
|---|---|---|---|---|---|
| 5,822,403 | A | * | 10/1998 | Rowan | ................. H04M 1/645 379/68 |
| 2009/0033473 | A1 | * | 2/2009 | Yu | .......................... G10K 9/122 340/384.6 |
| 2011/0002485 | A1 | * | 1/2011 | Onishi | ................. B06B 1/0603 381/190 |

FOREIGN PATENT DOCUMENTS

| JP | S61-37698 U | 3/1986 |
|---|---|---|
| JP | S64-084512 A | 3/1989 |
| JP | H05-145983 A | 6/1993 |
| JP | H11-052958 A | 2/1999 |
| JP | 2006-211412 A | 8/2006 |
| JP | 2009-017132 A | 1/2009 |

\* cited by examiner

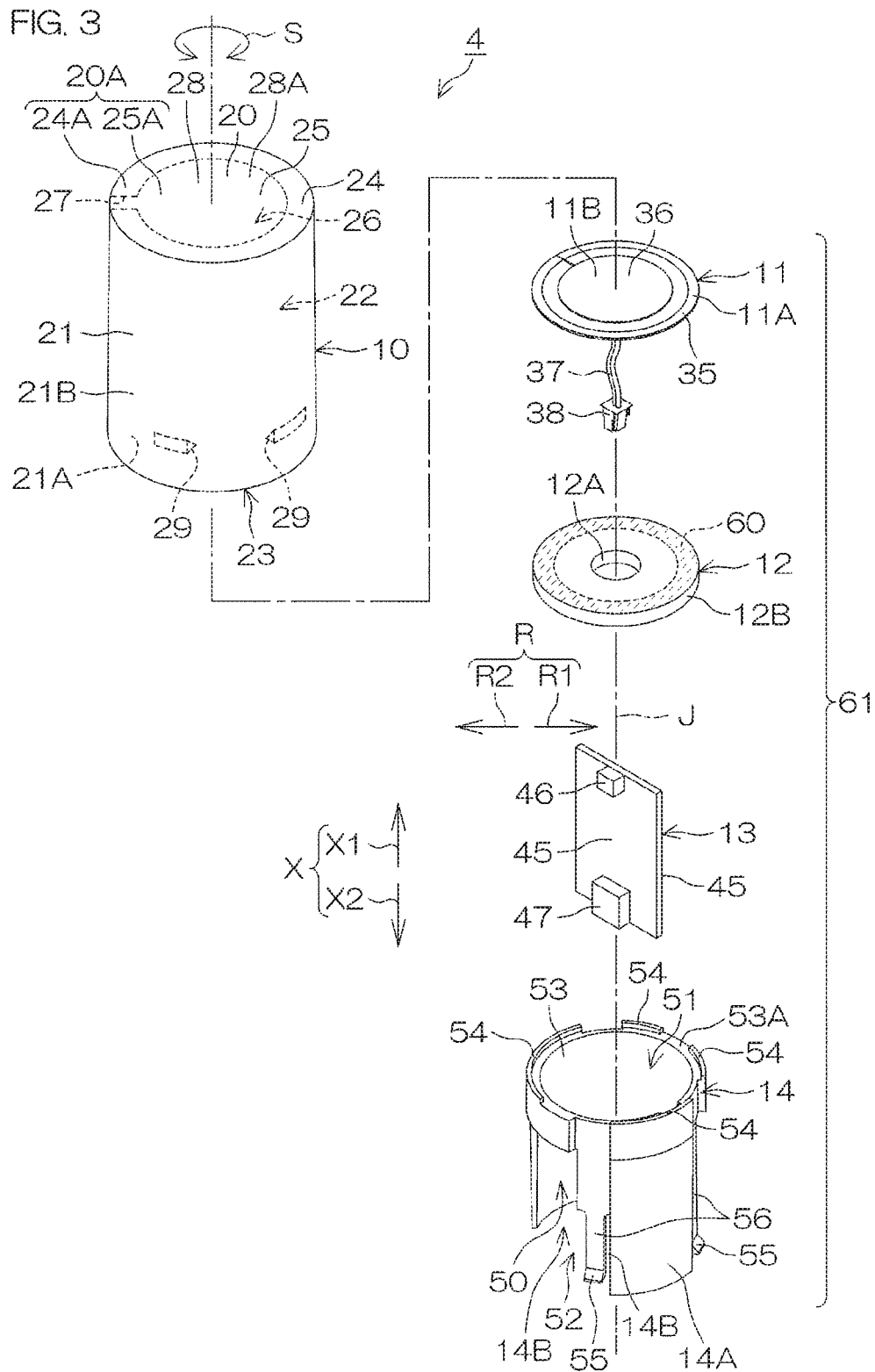

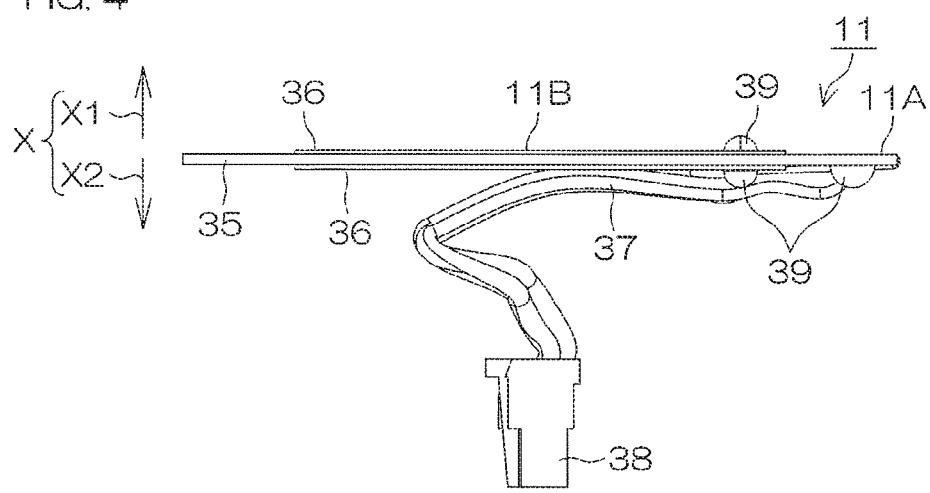

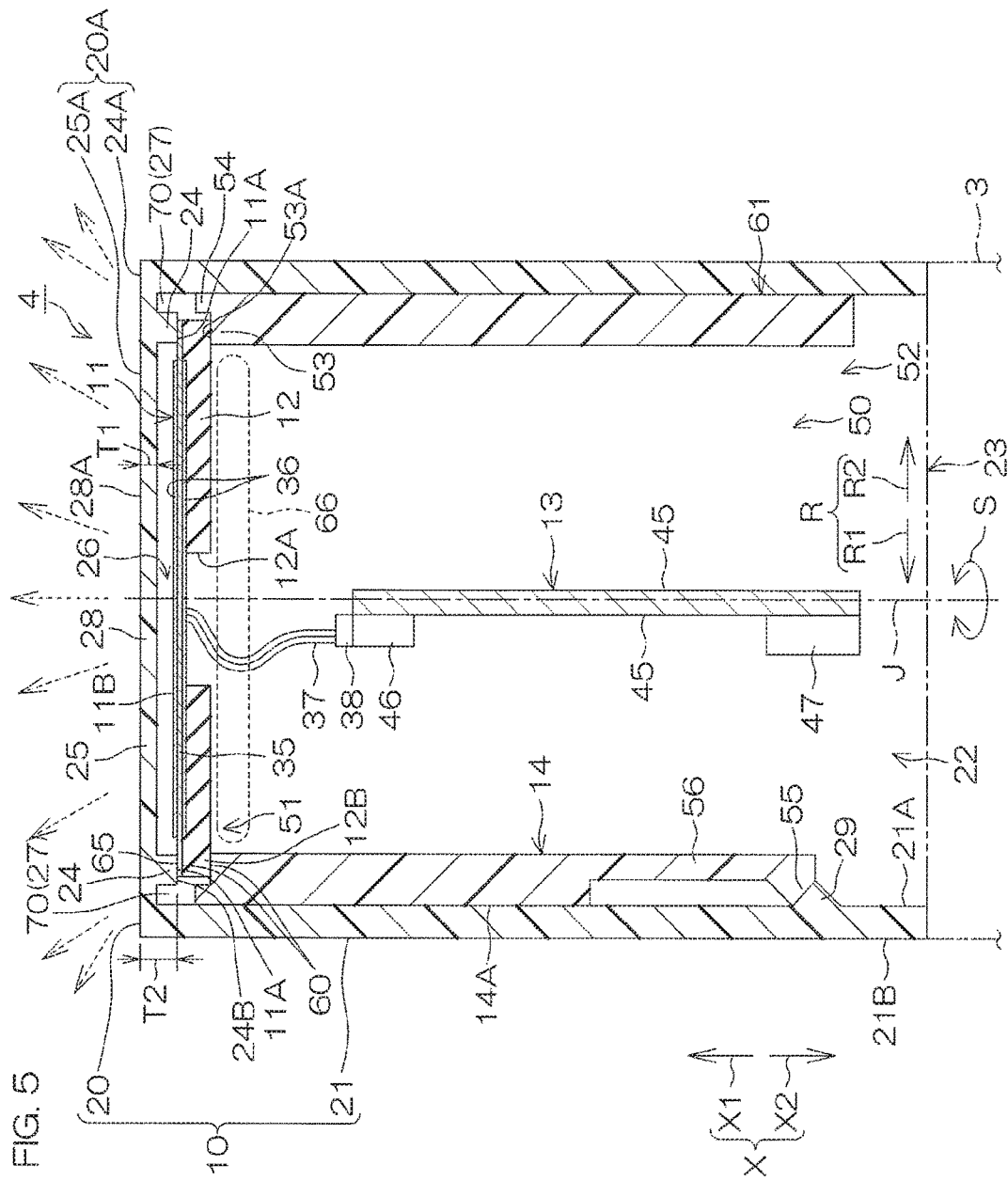

BUZZER UNIT AND SIGNAL INDICATOR LIGHT

TECHNICAL FIELD

This invention relates to a buzzer unit and a signal indicator light including the buzzer unit.

BACKGROUND ART

Patent literature 1 discloses a signal indicator light formed in a columnar shape which is long in a vertical direction. The signal indicator light includes a plurality of indicator units arranged along the vertical direction and a sound notification unit. An opening portion is formed in a side surface of a cylindrical case of the sound notification unit. A cylindrical portion extending in a horizontal direction is directed inside of the cylindrical case in the opening portion. A lid with an amplification throat portion is attached to this cylindrical portion. A communicating hole is formed vertically downward on an upper portion of an inner wall surface of the cylindrical portion. At an upper side of the communicating hole in the cylindrical case, a sound source installation portion which is a space for housing a speaker and its mounting substrate is formed. Sound waves generated from the speaker advance from the communicating hole to the amplification throat portion and diffuse from the opening portion toward the outside of the sound notification unit.

Patent literature 2 discloses an electric device including a housing with a substantially annular mounting portion for mounting a piezoelectric sounder on an inner surface of the housing. A sound emission hole penetrating the housing is formed at a substantially central position of the mounting portion. A piezoelectric vibrating plate constituting a piezoelectric sounder is attached to the mounting portion via an annular spacer. An empty chamber is formed by the piezoelectric vibrating plate, the spacer, the mounting portion, and the housing. Sound emitted by the piezoelectric vibrating plate is resonated in the empty chamber and is transmitted to the outside from the sound emission hole.

CITATION LIST

Patent Literature

Patent Literature 1: Japanese Patent Application Publication No. 2009-17132
Patent Literature 2: Japanese Patent Application Publication No. 2006-211412

SUMMARY OF INVENTION

Technical Problem

When sound waves diffuse from the opening portion of the sound notification unit of patent literature 1, sound pressure is different between peripheral portions of the opening portion and other portions away from the opening portion, so that directivity of sound is strong. Therefore, it is difficult to notify sound over a wide range around the sound notification unit. Additionally, contaminations such as external water, oil and the like may enter the sound source installation portion through the communicating hole. Thereby, when the communicating hole is blocked, sound waves will not be output from the communicating hole, so that sound pressure may decrease. Also, when contaminations enter the inside of the sound notification unit from the communicating hole, it takes time and effort to remove the contaminations. Also in the electric device of patent literature 2, the same problem as the sound notification unit of patent literature 1 is concerned.

This invention was done under such a background and this invention is intended to provide a buzzer unit capable of improving wide directivity, waterproofness and sound pressure, and having less contamination inside, and a signal indicator light including such a buzzer unit.

Solution to Problem

This invention provides a buzzer unit (4) including: a case (10) including a vibrating plate (28) in which no through-holes are formed, the case including a storage space (22) formed therein on one surface side (X2) of the vibrating plate, a vibrating element (11) which faces the vibrating plate in a plate thickness direction (X) of the vibrating plate inside the storage space, the vibrating element which produces vibration as a result of voltage being applied thereto and causes the vibrating plate to vibrate, and a pressing member (14) stored in the storage space, the pressing member pressing the vibrating element against the vibrating plate.

The parenthesized alphanumeric characters in this section correspond to reference characters of respective components in embodiments to be described later, but are not intended to limit the scope of the this invention.

According to this preferred embodiment, the vibrating element in the storage space of the case generates vibration by being applied with voltage, and vibrates the vibrating plate of the case. At this time, since the pressing member in the storage space presses the vibrating element against the vibrating plate, the degree of adhesion between the vibrating element and the vibration plate can be increased. Accordingly, vibration of the vibrating element can be efficiently transmitted to the vibrating plate, and the vibrating plate can be effectively vibrated. Therefore, it is possible to improve strength of sound waves generated by vibration of the vibrating plate, that is, sound pressure. The sound waves generated by vibration of the vibrating plate provided in the case and exposed to the outside diffuse toward a wide range around the case, so that wide directivity can be improved. In addition, since there are no through-holes in the vibrating plate, it is possible to prevent water and contaminations from entering into the storage space from the vibrating plate side. Thereby, waterproofness can be improved, and contaminations are hard to adhere to the inside of the buzzer unit.

In a preferred embodiment of this invention, the vibrating element includes a piezoelectric element (36).

According to this preferred embodiment, the vibrating element can be easily constructed by using the piezoelectric element.

In a preferred embodiment of this invention, the buzzer unit further includes an elastic member (12) disposed in a state sandwiched between the vibrating element and the pressing member in the storage space, the elastic member urging the vibrating element toward the vibrating plate.

According to this preferred embodiment, the degree of adhesion between the vibrating element and the vibrating plate can be further increased. Thereby, vibration of the vibrating element can be efficiently transmitted to the vibrating plate and the vibrating plate can be vibrated more effectively, so that sound pressure can be further improved.

In a preferred embodiment of this invention, the vibrating element is in the shape of a flat plate with a plate thickness direction coinciding with a plate thickness direction of the vibrating plate, the case includes a top plate (20) which includes a thick portion (24) opposed to an outer edge portion (11A) of the vibrating element from the plate thickness direction and a thin portion (25) opposed to an inner portion (11B) surrounded by the outer edge portion of the vibrating element from the plate thickness direction, the thick portion which the vibrating element is pressed against, the thin portion being thinner than the thick portion, at least the thin portion constitutes the vibrating plate, and a first space (26) surrounded by the thick portion and sandwiched between the thin portion and the vibrating element in the plate thickness direction is formed on one surface side of the vibrating plate.

According to this preferred embodiment, since the vibrating plate includes at least the thin portion formed thinner than the thick portion in the top plate of the case, when vibration of the vibrating element is transmitted, the thin portion can vibrate with a large amplitude. Thereby, sound pressure can be further improved. Since the vibrating element trying to move toward the vibrating plate side in response to vibration can enter the first space formed on the one surface side of the vibrating plate, it is possible to prevent vibration of the vibrating element from being disturbed. Therefore, the vibrating element and the thin portion of the vibrating plate are not constrained to each other, so that each of them can vibrate with large amplitude. Sound waves generated by the vibrating element are transmitted to the thin portion of the vibrating plate through air in the first space and vibrates the thin portion with large amplitude.

Since the vibrating element is brought into close contact with the thick portion by being pressed against the thick portion, vibration of the vibrating element is directly transmitted from the thick portion to the vibrating plate. Additionally, by pressing the vibrating element against the thick portion, it is possible to make the first space with constant narrowness so that the vibrating element and the thin portion come close to each other in a state of not constraining each other. Thereby, it is possible to effectively transmit sound waves generated by the vibrating element to the thin portion via air in the first space. Thereby of the above, vibration of the vibrating element can be more efficiently transmitted to the vibrating plate, and the vibrating plate can be more effectively vibrated.

In a preferred embodiment of this invention, the buzzer unit further includes a bonding member (65) bonding at least an outer edge portion of the vibrating element and the thick portion.

According to this preferred embodiment, the vibrating element and the vibrating plate can be disposed close to each other by bonding the vibrating element to the thick portion. Thereby, vibration of the vibrating element can be efficiently transmitted to the vibrating plate and the vibrating plate can be vibrated more effectively, so that sound pressure can be further improved.

In a preferred embodiment of this invention, the thick portion is formed in an annular shape, and a communicating portion (27) for communicating the first space with the outside of the thick portion is formed in the thick portion.

According to this preferred embodiment, it is possible to suppress vibration of the vibrating element and the vibrating plate from being disturbed by pressure of the first space, by releasing pressure of the first space by the communicating portion.

In a preferred embodiment of this invention, the pressing member includes a pressing portion (53) opposed to the outer edge portion of the vibrating element in the plate thickness direction and pressing the vibrating element against the vibration plate, and a second space (66) surrounded by the pressing portion is formed on a side opposite to the vibrating plate with respect to the vibrating element.

According to this preferred embodiment, since the vibrating element that tries to move to the side opposite to the vibrating plate in accordance with vibration can enter the second space surrounded by the pressing portion of the pressing member, vibration of the vibrating element can be prevented from being disturbed.

In a preferred embodiment of this invention, the buzzer unit further includes: a first engagement portion (29) provided in the case, and a second engagement portion (55) provided in the pressing member and engaged with the first engagement portion.

According to this preferred embodiment, since the case and the pressing member are coupled so as to be relatively immovable by engagement between the first engagement and the second engagement portion, the pressing member can reliably maintain a state that the pressing member presses the vibrating element against the vibrating plate.

A preferred embodiment of this invention provides a signal indicator light (1) including the buzzer unit with features mentioned above.

According to this preferred embodiment, the signal indicator light can improve wide directivity, waterproofness and sound pressure of the buzzer unit, and it is possible to prevent the inside of the buzzer unit from being stained.

In a preferred embodiment of this invention, the signal indicator light is formed in a columnar shape, and one end surface (1A) of the signal indicator light in an axial direction (X) thereof includes a surface (28A) of the vibrating plate.

According to this preferred embodiment, in the signal indicator light, sound can be emitted in all directions around a center axis line thereof.

In a preferred embodiment of this invention, the one end surface is an upper end surface of the signal indicator light.

According to this preferred embodiment, sound can be emitted in all directions on an outer peripheral surface of the signal indicator light. In addition, since there are no through-holes in the vibrating plate, water from an upper side can be prevented from entering into the signal indicator light.

BRIEF DESCRIPTION OF DRAWINGS

FIG. 3 is an exploded perspective view of the buzzer unit constituting the signal indicator light.

FIG. 4 is a side view of a vibrating element of the buzzer unit.

FIG. 5 is a schematic sectional view of a buzzer unit according to a variation of this invention.

DESCRIPTION OF EMBODIMENTS

Figure 1:
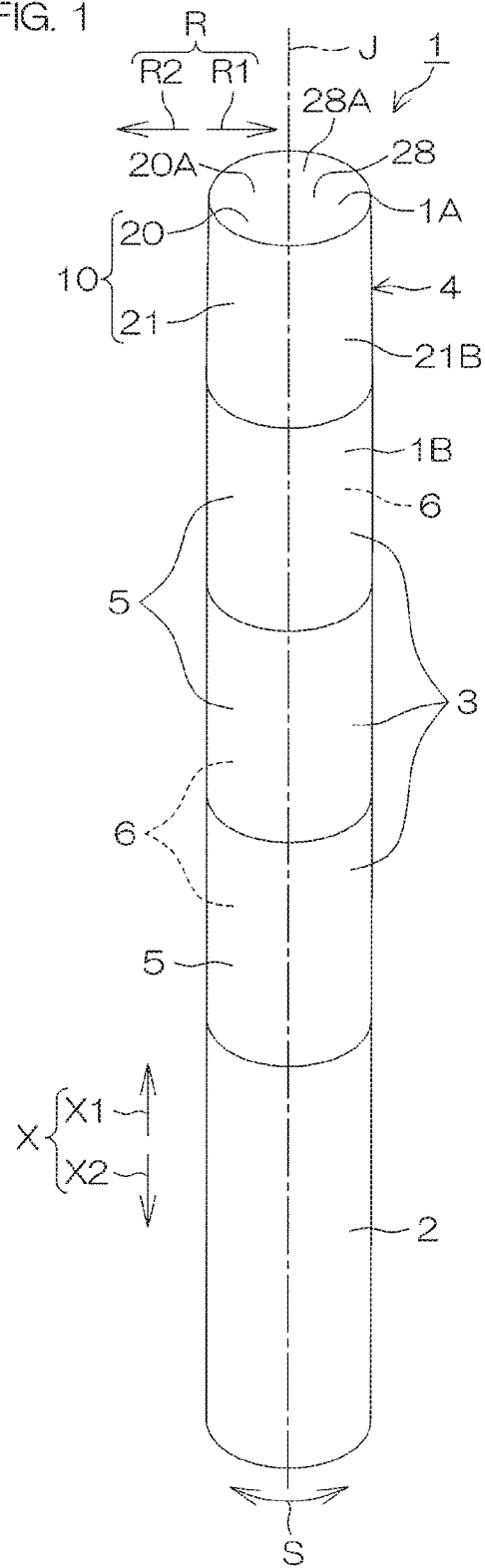
FIG. 1 is a perspective view of a signal indicator light according to a preferred embodiment of this invention.

Hereinafter, embodiments of this invention will be described in detail with reference to drawings. FIG. 1 is a perspective view of a signal indicator light 1 according to a preferred embodiment of this invention as viewed from above. The signal indicator light 1 is installed at, for example, a manufacturing site and is used to inform surrounding people of a situation or the like of each place in the manufacturing site. The signal indicator light 1 is formed in, for example, a columnar shape. An attitude of the signal indicator light 1 at the time of use can be arbitrarily changed according to usage conditions. For the sake of convenience, the following description will be made with reference to the signal indicator light 1 when a center axis line J of the signal indicator light 1 extends vertically. In this case, a vertical direction of a paper surface of FIG. 1 is a vertical direction X of the signal indicator light 1, an upper side of the paper surface is an upper side X1 of the signal indicator light 1, a lower side of the paper surface is a lower side X2 of the signal indicator light 1. The vertical direction X is also an axial direction in which the center axis line J extends in the signal indicator light 1.

The signal indicator light 1 includes a base unit 2, an indicator unit 3 that emits light, and a buzzer unit 4 that emits buzzer sound. The base unit 2, the indicator unit 3 and the buzzer unit 4 are formed in a cylindrical shape having substantially the same outer diameter, and their center axis lines are coincident with the center axis line J. The base unit 2 is located at a lower end of the signal indicator light 1. A single indicator unit 3 or a plurality of the indicator units 3 is/are coupled to the base unit 2 from the upper side X1. The buzzer unit 4 is coupled to the indicator unit 3 from the upper side X1 so as to be located at an upper end of the signal indicator light 1.

Hereinafter, each of the base unit 2, the indicator unit 3, and the buzzer unit 4 will be described by using a radial direction R and a peripheral direction S centered on the center axis line J of the signal indicator light 1 and the vertical direction X. In the radial direction R, a direction approaching the center axis line J is referred to as a radial inside R1, and a direction away from the center axis line J is referred to as a radial outside R2. In the signal indicator light 1 of the present embodiment, most of components other than electrical components such as a substrate or the like described later are made of resin, but materials of the signal indicator light 1 are not limited to resin. In connection with a term "coupling" in this specification, coupling two members means that one member is detachably attached to the other member by using an engaging structure or the like for engaging a projection of the one member with a groove in the other member, or that the one member is simply placed on the other member.

The base unit 2 is fixed to an installation target such as a machine tool or the like at a manufacturing site. A power supply substrate (not shown) for supplying electric power to the indicator unit 3 and the buzzer unit 4, and a control substrate (not shown) for controlling operations of the indicator unit 3 and the buzzer unit 4 are built in the base unit 2.

The indicator unit 3 includes a cylindrical case 5 having a light-transmitting property and a light-emitting unit 6 accommodated in the case 5. The light emitting unit 6 includes a substrate (not shown), a light source (not shown) such as an LED mounted on this substrate, and a lens (not shown). When electric power is supplied to the indicator unit 3 from the power supply substrate (not shown) of the base unit 2, the light source emits light. This light passes through the lens and the case 5 and is emitted from entire area of the indicator unit 3 in the peripheral direction S toward the periphery of the indicator unit 3. A light emission pattern of the indicator unit 3 is controlled by the control substrate (not shown) of the base unit 2. In the case where a plurality of indicator units 3 are present, each indicator unit 3 has the same form, but at least one of the case 5 and the lens in each indicator unit 3 may be colored with a different color from that of other indicator unit 3 so that emission color is different for each indicator unit 3. Alternatively, while the case 5 and the lens are same color between indicator units 3, emission color of the light source may be different for each indicator unit 3.

Figure 2:
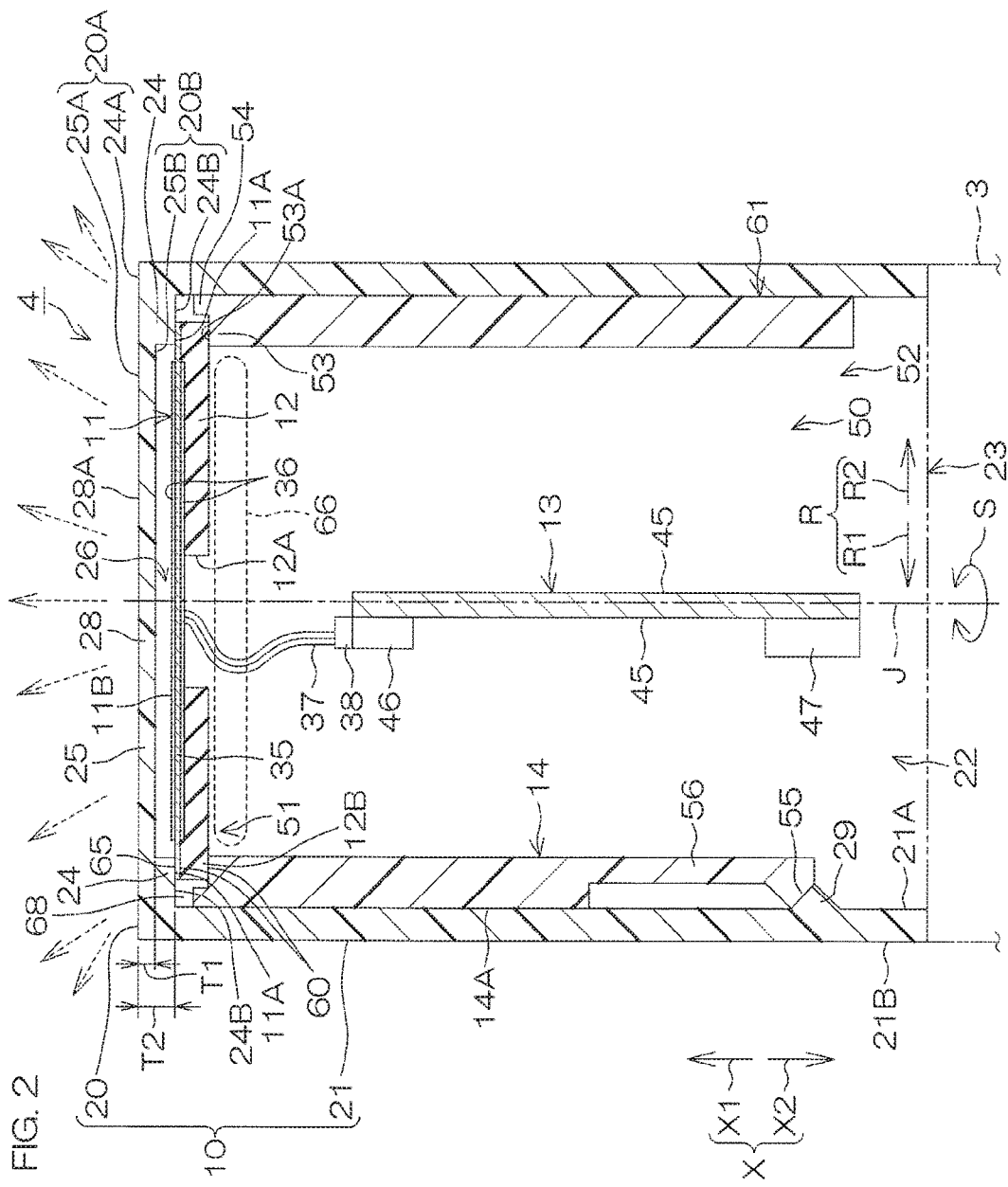
FIG. 2 is a schematic sectional view of a buzzer unit.

FIG. 2 is a schematic longitudinal sectional view of the buzzer unit 4. FIG. 3 is an exploded perspective view of the buzzer unit 4. The buzzer unit 4 includes a cylindrical case 10, a disk-shaped vibrating element 11, an annular elastic member 12, a substrate 13, and a pressing member 14 that is cylindrical and smaller than the case 10 and accommodates the substrate 13. The vibrating element 11, the elastic member 12 and the pressing member 14 are accommodated in the case 10 in a state in which their center axis lines are coincident with a center axis line of the case 10. In this state, center axis lines of the case 10, the vibrating element 11, the elastic member 12 and the pressing member 14 respectively coincide with the center axis line J.

The case 10 integrally includes a disk-shaped top plate 20 having a thickness direction which is coincident with the vertical direction X, and an annular wall 21 which is formed in a circularly annular shape and extends from entire regions in the peripheral direction S of an outer peripheral edge of the top plate 20 to the lower side X2. In the case 10, a substantially columnar storage space 22 surrounded by the top plate 20 and the annular wall 21 is formed. The storage space 22 is closed from the upper side X1 by the top plate 20. A portion surrounded by a lower end of the annular wall 21 is an opening portion 23 which exposes the storage space 22 from the case 10 to the lower side X2. Since there are no through-holes in whole regions of each of the top plate 20 and the annular wall 21, the storage space 22 is not exposed to the outside of the case 10 from portions other than the opening portion 23 of the case 10.

The top plate 20 integrally includes a thick portion 24 formed in an annular shape (circularly annular shape in the present embodiment) extending in the peripheral direction S as an outer circumferential portion of the top plate 20, and a thin portion 25 formed in a substantially disk shape positioned radial inside R1 from the thick portion 24. A thickness T1 (about 1 mm, for example) of the thin portion 25 in the vertical direction X is thinner than a thickness T2 (about 2 mm, for example) of the thick portion 24 in the vertical direction X (see FIG. 2). An upper surface 24A of the thick portion 24 and an upper surface 25A of the thin portion 25 are flush with each other and constitute an outer surface 20A of the top plate 20, but a lower surface 24B of the thick portion 24 is located on the lower side X2 from a lower surface 25B of the thin portion 25. Therefore, a concave first space 26 depressed to the upper side X1 is formed in a region on a side of the center axis line J in the inner surface 20B formed by the lower surface 24B and the lower surface 25B of the top plate 20. The first space 26 is a part of the storage space 22 and is surrounded by the thick portion 24 from the radial outside R2. At a single location or a plurality of locations in the peripheral direction S of the thick portion 24, a communicating portion 27 is formed by cutting a part of the thick portion 24 along the radial direction R (see FIG. 3). An end portion of the radial outside R2 of the communicating portion 27 communicates with regions (the outside of the thick portion 24) other than the first space 26 in the storage space 22 from the upper side X1. Therefore, the communicating portion 27 communicates the first space 26 with the regions. An arbitrary configuration other than the groove shape can be adopted as the communicating portion 27. For example, the communicating portion 27 may be a hole that allows the first space 26 to communicate with the regions.

The thin portion 25 and a portion adjacent to the thin portion 25 in the thick portion 24 constitute a vibrating plate 28. The first space 26 is positioned on the lower side X2 which is one surface side of the vibrating plate 28 with respect to the vibrating plate 28. A claw-shaped first engagement portion 29 projecting to the radial inside R1 is provided at a position biased toward the lower side X2 on an inner peripheral surface 21A of the annular wall 21. A single first engagement portion 29 or a plurality of the first engagement portions 29 is/are present, and in the case where a plurality of the first engagement portions 29 are provided, the first engagement portions 29 are arranged with an interval in the peripheral direction S.

The vibrating element 11 is formed in a flat-plate shape having a plate thickness direction coinciding with the vertical direction X. Specifically, the vibrating element 11 has a simple configuration including a disk-shaped metal plate 35, a disk-shaped piezoelectric element 36 having a diameter which is smaller than that of the metal plate 35, an electric wire 37, and a connector 38. In this embodiment, the metal plate 35 is made of iron and the piezoelectric element 36 is made of ceramics, but different materials may be used for the metal plate 35 and the piezoelectric element 36, respectively. As shown in FIG. 4, a pair of the piezoelectric elements 36 are provided, and are bonded to the metal plate 35 so as to sandwich the metal plate 35 in the vertical direction X. One end portion of the electric wire 37 is connected to the connector 38 and the other end portion of the electric wire 37 is connected to an electrode 39 provided in each of the metal plate 35 and the piezoelectric element 36. An outer peripheral portion of the metal plate 35 constitutes an outer edge portion 11A of the vibrating element 11.

As shown in FIGS. 2 and 3, the elastic member 12 is an annular sheet made of an elastic body such as urethane, sponge, rubber or the like. Therefore, the elastic member 12 has an insertion hole 12A penetrating the elastic member 12 through a central axis thereof.

The substrate 13 has a pair of parallel main surfaces 45 extending in the vertical direction X. A first connector 46 is provided at an upper end portion of the substrate 13 and a second connector 47 is provided at a lower end portion of the substrate 13. The first connector 46 and the second connector 47 may be provided on the same main surface 45 of the substrate 13 or may be provided separately on separate main surfaces 45 respectively.

The pressing member 14 is formed with an inner space 50 constituting a hollow portion of the pressing member 14, a first opening portion 51 opening the inner space 50 to the upper side X1, and a second opening portion 52 opening the inner space 50 to the lower side X2. The pressing member 14 includes an annular pressing portion 53 surrounding the first opening portion 51, and a projected line portion 54 protruding from an outer peripheral edge of an upper end surface 53A of the pressing portion 53 toward the upper side X1 and extending in the peripheral direction S. In this embodiment, a plurality of the projected line portions 54 are arranged at intervals in the peripheral direction S. However, a single projected line portion 54 may be provided over entire regions of an outer peripheral edge of the pressing portion 53 in the peripheral direction S.

At a position deviated to the lower side X2 on an outer peripheral surface 14A of the pressing member 14, claw-shaped second engagement portions 55 projecting to the radial outside R2 are provided at positions corresponding to the first engagement portions 29 in the peripheral direction S. The number of the second engagement portions 55 is same as the number of the first engagement portions 29. The pressing member 14 is formed with a notch 14B extending from a lower end edge of the pressing member 14 toward a midway portion of the pressing member 14 in the vertical direction X to the upper side X1 (see FIG. 3). The notch 14B cuts out a part of the pressing member 14 in the peripheral direction S. A pair of the notches 14B may be provided on both sides of the second engagement portion 55 in the peripheral direction S. In this case, a portion between the pair of notches 14B in the pressing member 14 constitutes an arm portion 56 extending to the lower side X2. The second engagement portion 55 is provided at a lower end portion of the arm portion 56. The arm portion 56 is elastically deformable so that the second engagement portion 55 can move along the radial direction R.

Next, assembly of the buzzer unit 4 will be described. First, as shown in FIG. 3, an operator arranges the vibrating element 11, the elastic member 12 and the substrate 13 in this order from the upper side X1, and inserts the connector 38 of the vibrating element 11 into the insertion hole 12A of the elastic member 12 from the upper side X1 and connects the connector 38 to the first connector 46 of the substrate 13.

Next, the operator inserts the substrate 13 from the upper side X1 into the first opening portion 51 of the pressing member 14 so that a side of the second connector 47 becomes the head, and accommodates the substrate 13 in the inner space 50 of the pressing member 14. Thereby, the outer peripheral portion 12B of the elastic member 12 is placed on the pressing portion 53 of the pressing member 14 and positioned by the projected line portion 54 from the radial outside R2, and the vibrating element 11 is placed on the elastic member 12. A bonding member 60 made of a double sided tape or an adhesive is provided on an upper surface and a lower surface of the outer peripheral portion 12B of the elastic member 12. Therefore, the outer edge portion 11A of the vibrating element 11 is bonded to an upper surface of the outer peripheral portion 12B of the elastic member 12, and the upper end surface 53A of the pressing portion 53 is bonded to a lower surface of the outer peripheral portion 12B of the elastic member 12. The vibrating element 11, the elastic member 12, the substrate 13 and the pressing member 14 integrated in this way constitute an inner assembly 61. The substrate 13 is held in the inner space 50 by being engaged with an engagement portion (not shown) provided at the pressing member 14.

Next, the operator places the completed inner assembly 61 on the lower side X2 of the case 10 and inserts the inner assembly 61 from the lower side X2 with respect to the opening portion 23 of the case 10 so that the vibrating element 11 becomes the head. Thereby, the entire inner assembly 61 is accommodated in the storage space 22 of the case 10. As shown in FIG. 2, when the second engagement portion 55 of the pressing member 14 climbs over the first engagement portion 29 of the case 10 to the upper side X1 and engages with the first engagement portion 29 from the upper side X1, the inner assembly 61 in the storage space 22 is in a state of being fixed to the case 10. Thereby, the buzzer unit 4 is completed.

In the completed buzzer unit 4, the vibrating element 11 in the storage space 22 is opposed to the top plate 20 of the case 10 from the lower side X2. More specifically, in the vibrating element 11, the outer edge portion 11A is opposed to the thick portion 24 of the top plate 20, that is, an outer edge portion of the vibrating plate 28 from the lower side X2, and an inner portion 11B surrounded by the outer edge portion 11A in the vibrating element 11 is opposed to the thin portion 25 of the top plate 20, that is, an inner portion of the vibrating plate 28 from the lower side X2. A bonding member 65 made of a double sided tape or an adhesive is provided on an upper surface of the outer edge portion 11A in advance. Thereby, at least the outer edge portion 11A is bonded to the thick portion 24. The vibrating element 11 can be easily fixed to the top plate 20 by the bonding member 65. The first space 26 provided on the inner surface 20B of the top plate 20 is sandwiched and closed from the vertical direction X by the thin portion 25 and the inner portion 11B, and is communicated with other regions (regions on the lower side X2 than the first space 26 in the inner space 50) from only the communicating portion 27. A gap 68 in the vertical direction X between the thick portion 24 and the pressing portion 53 of the pressing member 14 is one of communication paths for communicating the first space 26 with the other regions.

The pressing portion 53 is opposed to the outer edge portion 11A of the vibrating element 11 from the lower side X2. The outer peripheral portion 12B of the elastic member 12 is disposed in a compressed state while being sandwiched from the vertical direction X by the outer edge portion 11A and the pressing portion 53. Thereby, the outer peripheral portion 12B of the elastic member 12 tries to return to a state before being compressed, thereby is always urging the vibrating element 11 toward the vibrating plate 28 (more specifically, the thick portion 24) on the upper side X1. That is, the pressing portion 53 compresses the elastic member 12, thereby is pressing the vibrating element 11 against the thick portion 24 of the vibration plate 28. A second space 66 surrounded by the pressing portion 53 is formed on a lower side X2 which is an opposite side to the vibration plate 28 with respect to the vibrating element 11. The second space 66 is a part of the storage space 22 and adjoins the elastic member 12 from the lower side X2.

When the operator couples the buzzer unit 4 to the indicator unit 3 from the upper side X1, the signal indicator light 1 is completed. An upper end surface 1A which is one end surface of the completed signal indicator light 1 in the vertical direction X is constituted by the outer surface 20A of the top plate 20 of the case 10 of the buzzer unit 4 (see FIG. 1). Therefore, the upper end surface 1A includes a surface 28A of the vibrating plate 28 exposed outside. Additionally, in the completed signal indicator light 1, since the opening portion 23 of the case 10 of the buzzer unit 4 is closed by the indicator unit 3 from the lower side X2, the storage space 22 of the case 10 is completely sealed. The second connector 47 of the substrate 13 of the buzzer unit 4 is connected to a connector (not shown) provided on a substrate (not shown) of the indicator unit 3. Thereby, the substrate 13 is electrically connected to the power supply substrate (not shown) and the control substrate (not shown) in the base unit 2 via the substrate of the indicator unit 3. When electrical power from the power supply substrate is supplied to the substrate 13, voltage is applied to the vibrating element 11. Then, the piezoelectric element 36 expands and contracts, and expansion and contraction thereof is transmitted to the metal plate 35, whereby the metal plate 35 alternately bends to the upper side X1 and the lower side X2. Thereby, the entire vibrating element 11 (in particular, the inner portion 11B) vibrates in the vertical direction X. This vibration is transmitted to the vibrating plate 28 at the thick portion 24 of the top plate 20 and/or is transmitted to the vibrating plate 28 via air in the first space 26 so that the entire vibrating plate 28 vibrates in the vertical direction X. Thereby, sound waves are generated.

As described above, since the pressing member 14 presses the vibrating element 11 against the vibration plate 28, the degree of adhesion between the vibrating element 11 and the vibration plate 28 can be increased. Since the case 10 and the pressing member 14 are connected so as to be relatively immovable by engagement between the first engagement portion 29 and the second engagement portion 55, the pressing member 14 can reliably maintain a state that the pressing member 14 presses the vibrating element 11 against the vibration plate 28. Additionally, the vibrating element 11 is bonded to the thick portion 24 of the top plate 20 of the case 10 by the bonding member 65 and is urged toward the vibrating plate 28 by the elastic member 12. Thereby, the vibrating element 11 and the vibrating plate 28 can be disposed close to each other, and the degree of adhesion between them can be further increased.

As a result of increasing the degree of adhesion between the vibrating element 11 and the vibrating plate 28 in this way, vibration of the vibrating element 11 can be efficiently transmitted to the vibrating plate 28 to effectively vibrate the vibrating plate 28. Therefore, sound pressure which is strength of sound waves generated by vibration of the vibrating plate 28 can be improved. Additionally, since the vibrating plate 28 includes at least the thin portion 25 formed thinner than the thick portion 24 in the top plate 20 of the case 10, when vibration of the vibrating element 11 is transmitted, the thin portion 25 can vibrate with large amplitude. Thereby, sound pressure can be further improved. Additionally, in the buzzer unit 4 that vibrates the vibrating plate 28 exposed outside, the value of voltage applied to the vibrating element 11 is controlled by the control substrate (not shown) of the base unit 2, whereby sound having a wide sound range from low tone to high tone can be generated.

Sound waves generated by vibration of the vibrating plate 28 which is provided in the case 10 and is exposed outside diffuse radially to a wide range around the case 10, specifically the upper side X1 and the radial outside R2 in entire regions in the direction S as shown by dashed arrow in FIG. 2. Thereby, the buzzer unit 4 with wide directivity in particular substantially omnidirectional can be obtained. That is, the buzzer unit 4 can obtain directional characteristics which are suitable for a purpose of announcing sound over a wide range. Additionally, since there are no through-holes in the vibrating plate 28 and the storage space 22 is completely sealed, it is possible to prevent intrusion of water and contaminations into the storage space 22. Thereby, it is possible to improve waterproofness, and also it is difficult for contaminations to stick inside the buzzer unit 4. Since the signal indicator light 1 including such a buzzer unit 4 can improve wide directivity in the buzzer unit 4, the signal indicator light 1 can emit sound with high sound pressure to all directions (a full range of 360 degrees on the outer peripheral surface 1B) around the center axis line J (see FIG. 1). Additionally, since there are no through-holes in the vibrating plate 28 constituting the upper end surface 1A of the signal indicator light 1, entering of water from the upper side X1 into the signal indicator light 1 can be prevented. Therefore, the signal indicator light 1 can improve waterproofness and prevent contaminations from adhering to inside thereof.

The vibrating element 11 which tries to move toward the vibrating plate 28 in accordance with vibration can enter the first space 26 formed on the lower side X2 of the vibrating plate 28. On the other hand, the vibrating element 11 which tries to move to the lower side X2 opposite to the vibration plate 28 according to vibration can enter the second space 66 surrounded by the pressing portion 53 of the pressing member 14. That is, a space for vibrating the vibrating element 11 is secured on both sides of the vibrating element 11 in the vertical direction X. Therefore, it is possible to prevent vibration of the vibrating element 11 in the vertical direction X from being disturbed. When the vibrating element 11 tries to move to the lower side X2, the elastic member 12 can be elastically deformed to the lower side X2 so as not to disturb movement of the vibrating element 11. Additionally, by releasing pressure in the first space 26 by the communicating portion 27 (see FIG. 3) formed in the thick portion 24, vibration of the vibrating element 11 and the vibration plate 28 is can be prevented from being disturbed by pressure in the first space 26.

Additionally, in the vibrating element 11, only the outer edge portion 11A is pressed against the thick portion 24 of the top plate 20, but the inner portion 11B is separated from the thin portion 25 of the top plate 20. Therefore, since the inner portion 11B and the thin portion 25 of the vibrating plate 28 are not constrained to each other, each of them can vibrate with large amplitude. Sound waves generated by the vibrating element 11 are transmitted to the thin portion 25 via air in the first space 26 and vibrates the thin portion 25 with large amplitude. Since the vibrating element 11 is brought into close contact with the thick portion 24 by being pressed against the thick portion 24, vibration of the vibrating element 11 is directly transmitted from the thick portion 24 to the vibration plate 28. Additionally, it is possible to make the first space 26 with constant narrowness in the vertical direction X so that the vibrating element 11 and the thin portion 25 can approach to each other in mutually non-constraint state by pressing the vibrating element 11 against the thick portion 24. Thereby, it is possible to effectively transmit sound waves generated by the vibrating element 11 to the thin portion 25. Thereby of the above, vibration of the vibrating element 11 can be transmitted to the vibrating plate 28 more efficiently so that the vibration plate 28 can be more effectively vibrated.

This invention is not limited to the embodiment described above, various modifications may be made within the scope of the this invention defined by the following claims.

For example, as shown in FIG. 5, a groove 70 extending in the peripheral direction S may be formed as a part of the communicating portion 27 between the thick portion 24 of the top plate 20 of the case 10 and the annular wall 21. The thick portion 24 may be separated from the annular wall 21 to the radial inside R1 by the groove 70. Thereby, free motion of the inner portion 11B of the vibrating element 11 can be promoted, so that the vibrating element 11 can be more effectively vibrated.

Additionally, in a general manufacturing site, environmental sound having sound pressure of about 75 dB is generated. In this situation, in order to accurately recognize sound of the buzzer unit 4, it is preferable that target sound pressure of the buzzer unit 4 is set so as to exceed sound pressure of the environmental sound by about 10 dB. For this target sound pressure, when an outer diameter of the vibrating element 11 is 70 mm, the thickness T1 of the thin portion 25 of the top plate 20 of the case 10 is preferably about 0.75 mm. When the outer diameter of the vibrating element 11 is 60 mm or less, the thickness T1 is preferably about 1 mm.

Additionally, when the outer surface 20A of the top plate 20 constituting the vibrating plate 28 is not convexly curved to the upper side X1 but is flat in a direction orthogonal to the center axis line J, the buzzer unit 4 can emit large sound with high sound pressure. In other words, it is preferable to secure a large flat outer surface 20A in order to increase sound pressure. For the same purpose, it is preferable not to provide a chamfer at a boundary portion between the outer surface 20A and the outer peripheral surface 21B of the annular wall 21 in the case 10.

In addition, although the case 10 is cylindrical, it may be cubic. In response to this, the signal indicator light 1 may be, for example, a quadrangular columnar shape instead of a cylindrical shape.

In addition, instead of directly holding the substrate 13 by the pressing member 14, the pressing member 14 may indirectly hold the substrate 13 by the substrate 13 engaged to another member disposed in the inner space 50 of the pressing member 14.

In addition, instead of the piezoelectric element 36, an electric actuator such as a motor or a solenoid may be used as the vibrating element 11.

In addition, the vibrating element 11 may have a unimorph type configuration in which the piezoelectric element 36 is attached only on one side surface of the metal plate 35, instead of a bimorph type configuration in which the metal plate 35 is sandwiched between the pair of piezoelectric elements 36 as described above, for example. In the case of using the unimorph type vibrating element 11 in which the piezoelectric element 36 is attached only to a lower surface of the metal plate 35, upper surfaces of both the outer edge portion 11A and the inner portion 11B of the vibrating element 11 may be brought into close contact with the top plate 20. In this case, the first space 26 in the inner surface 20B of the top plate 20 is omitted.

In addition, the signal indicator light 1 may include a communication unit with a communication function for communicating with an external device, in addition to the indicator unit 3. In addition, a rotating lamp may be used as the indicator unit 3.

REFERENCE SIGNS LIST 1 signal indicator light
1A upper end surface
4 buzzer unit
10 case
11 vibrating element
11A outer edge portion
11B inner portion
12 elastic member
14 pressing member
20 top plate
22 storage space
24 thick portion
25 thin portion
26 first space
27 communicating portion
28 vibrating plate
28A surface
29 first engagement portion
36 piezoelectric element
53 pressing portion
55 second engagement portion
65 bonding member
66 second space
X vertical direction
X2 lower side

The invention claimed is:
1. A buzzer unit, comprising:
  a case including a vibrating plate in which no through-holes are formed, the case including a storage space formed therein on one surface side of the vibrating plate;

a vibrating element which faces the vibrating plate in a plate thickness direction of the vibrating plate inside the storage space, the vibrating element producing vibration as a result of voltage being applied thereto and causing the vibrating plate to vibrate; and a pressing member stored in the storage space, the pressing member pressing the vibrating element against the vibrating plate, wherein the vibrating element is a flat plate having a thickness in a same direction as a plate thickness direction of the vibrating plate, the vibrating element having an outer edge portion and an inner portion surrounded by the outer edge portion;

the case includes a top plate having
- a thick portion facing the outer edge portion of the vibrating element from the plate thickness direction, and
- a thin portion facing the inner portion of the vibrating element from the plate thickness direction, the vibrating element being pressed against the thick portion, the thin portion being thinner than the thick portion;

at least the thin portion constitutes the vibrating plate;

a first space is formed on one surface side of the vibrating plate, the first space being surrounded by the thick portion of the case, and being sandwiched between the thin portion of the case and the vibrating element in the plate thickness direction;

the pressing member includes a pressing portion facing the outer edge portion of the vibrating element in the plate thickness direction, and pressing the vibrating element against the vibrating plate;

a second space is formed on a side opposite to the vibrating plate with respect to the vibrating element, the second space being surrounded by the pressing portion;

the thick portion of the case is formed in an annular shape; and a communicating portion for communicating the first space with the second space that is an outside of the thick portion of the case, is formed in the thick portion.

2. The buzzer unit according to claim 1, wherein the vibrating element includes a piezoelectric element.

3. The buzzer unit according to claim 1, further comprising an elastic member disposed to be sandwiched between the vibrating element and the pressing member in the storage space, the elastic member urging the vibrating element toward the vibrating plate.

4. The buzzer unit according to claim 1, further comprising a bonding member bonding at least the outer edge portion of the vibrating element and the thick portion.

5. The buzzer unit according to claim 1, further comprising:
- a first engagement portion provided in the case; and
- a second engagement portion provided in the pressing member and being engaged with the first engagement portion.

6. A signal indicator light including the buzzer unit according to claim 1.

7. The signal indicator light according to claim 6, wherein the signal indicator light is formed in a columnar shape; and one end surface of the signal indicator light in an axial direction thereof includes a surface of the vibrating plate.

8. The signal indicator light according to claim 7, wherein the one end surface is an upper end surface of the signal indicator light.

\* \* \* \* \*